United States Patent [19]

Tsutsui

[11] Patent Number: 4,611,967
[45] Date of Patent: Sep. 16, 1986

[54] CASSETTE-TYPE CONTAINER FOR A SHEET-LIKE MEMBER

[75] Inventor: Shinji Tsutsui, Kawasaki, Japan

[73] Assignee: Canon Kabushiki Kaisha, Tokyo, Japan

[21] Appl. No.: 750,282

[22] Filed: Jul. 1, 1985

[30] Foreign Application Priority Data

Jul. 6, 1984 [JP] Japan ............................ 59-140197
Jun. 5, 1985 [JP] Japan ............................ 60-122182

[51] Int. Cl.⁴ .................. B65D 85/30; G03B 9/02; G03B 41/16
[52] U.S. Cl. ................... 414/411; 222/337; 206/332
[58] Field of Search ............... 220/337, 340, 324, 334; 206/332; 414/411

[56] References Cited

U.S. PATENT DOCUMENTS

| | | | |
|---|---|---|---|
| 2,225,722 | 12/1940 | Spieth | 220/334 |
| 3,105,903 | 10/1963 | Sano et al. | 414/411 |
| 3,111,585 | 11/1963 | Sano et al. | 414/411 |
| 3,192,381 | 6/1965 | Zurowski et al. | 220/334 |
| 3,828,195 | 8/1974 | Snorr | 414/411 |
| 3,900,405 | 8/1975 | Bartlett et al. | 414/411 |
| 3,949,872 | 4/1976 | Paudros | 220/334 |
| 4,249,818 | 2/1981 | Buldini | 414/411 |
| 4,553,369 | 11/1985 | Debes et al. | 414/411 |

FOREIGN PATENT DOCUMENTS 945181 6/1956 Fed. Rep. of Germany ...... 220/337

Primary Examiner—Lawrence J. Oresky
Attorney, Agent, or Firm—Fitzpatrick, Cella, Harper & Scinto

[57] ABSTRACT

A cassette-type container for a sheet-like member, includes a lower member for carrying the sheet-like member, an upper member engageable with the lower member to define a closed chamber, a guide channel formed in the upper member, for guiding rectilinear movement of the upper member when it is engaged by or disengaged from the lower member, a guide pin formed on the lower member and engageable with the guide channel so that the upper member is pivotally movable relative to the lower member, and a member for holding the upper member and lower member against separation. According to another aspect, there is provided an automatic feeding system for a sheet-like member and usable with such container as described above, the system having a holder for the upper member, a member for applying a biasing force to urge the holder to rotate it about the guide pin, a fork adapted to separate the lower member from the upper member, and an elevator for moving the fork in a direction perpendicular to the direction of the rectilinear movement of the lower member.

2 Claims, 18 Drawing Figures

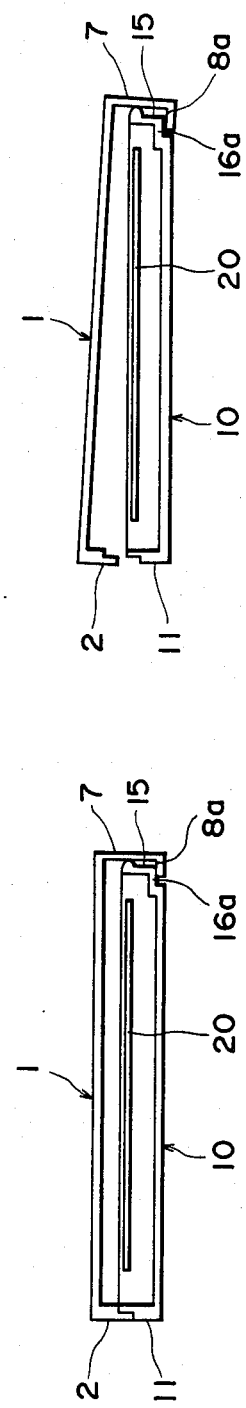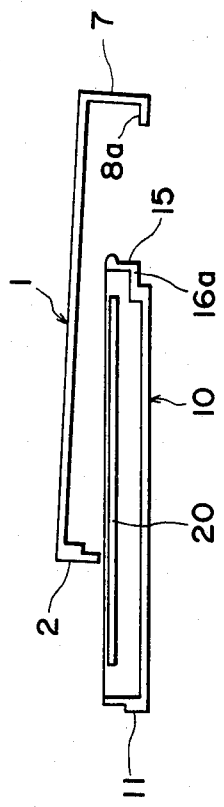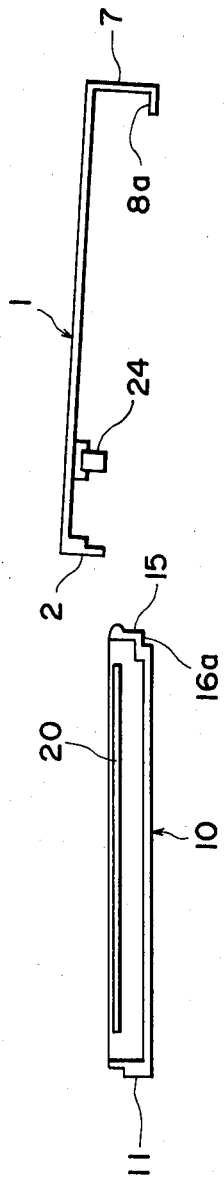

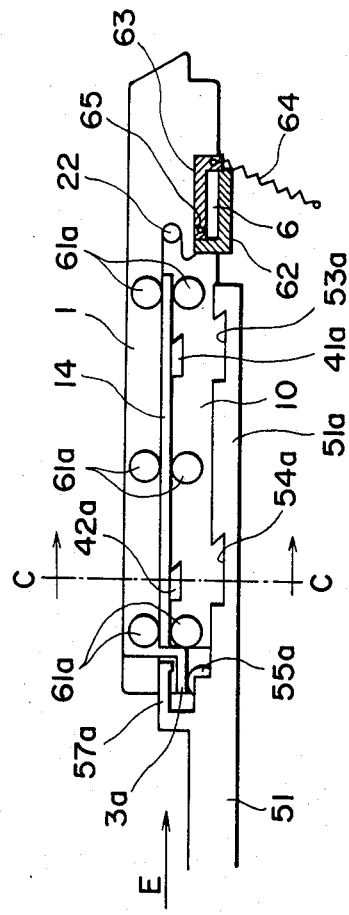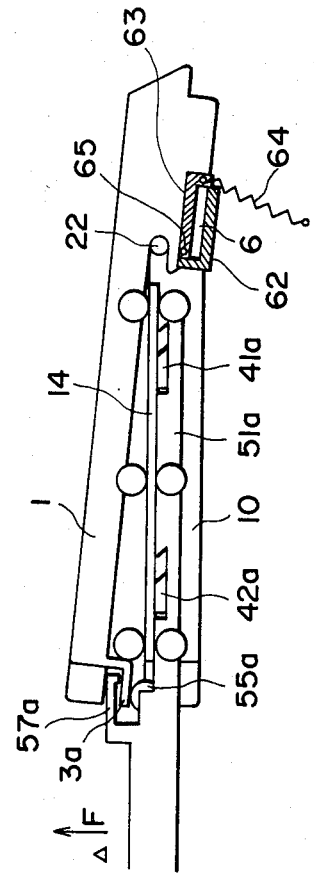

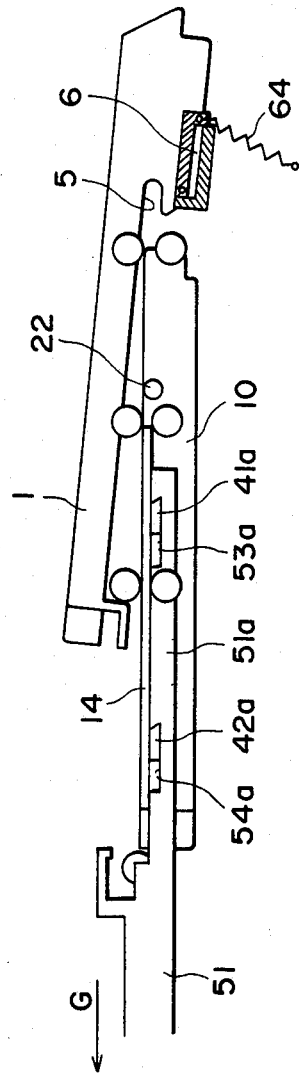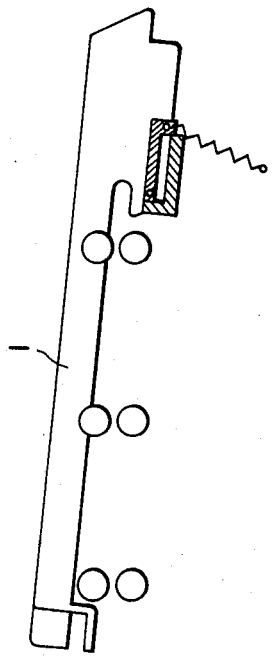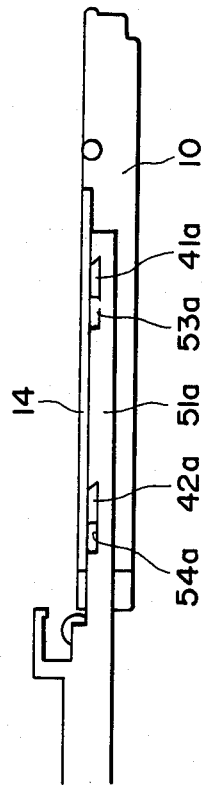
FIG. 9C
FIG. 9D

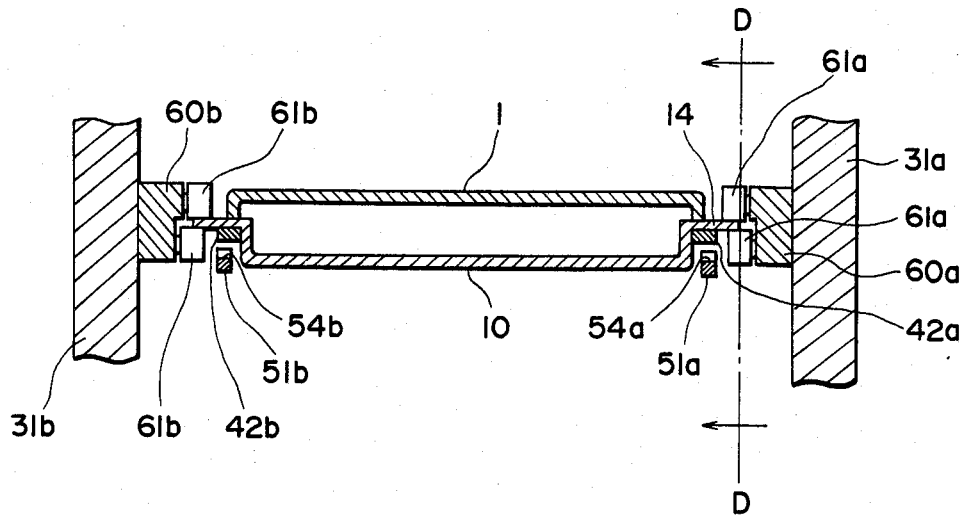
FIG. 10
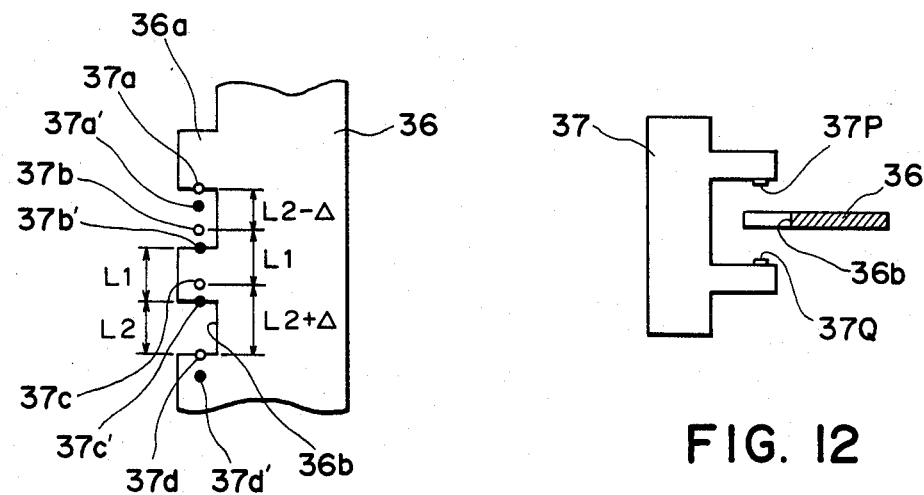
FIG. 11
FIG. 12

CASSETTE-TYPE CONTAINER FOR A SHEET-LIKE MEMBER

BACKGROUND OF THE INVENTION

This invention relates to a cassette-type container for a sheet-like member and to an automatic feeding system, including such container, for feeding the sheet-like member. More particularly, the invention is concerned with a dust-shield cassette for containing a photomask or a reticle, for use in the manufacture of semiconductor devices, and also with an automatic feeding system usable with such dust-shield cassette for feeding the photomask or reticle and suitably applicable to a semiconductor device manufacturing apparatus.

In the manufacture of semiconductor devices such as integrated circuits (ICs), large scaled integrated circuits (LSIs) and very large scaled integrated circuits (VLSIs), there are many problems which have not been solved satisfactorily. One of these problems is prevention of adhesion of dust or foreign particles onto the mask or reticle (which hereinafter will be referred to simply as "mask"). If any foreign particles adhere to the mask having a very minute circuit pattern to be transferred onto a silicon wafer or the like, these foreign particles will damage the circuit pattern transferred onto the wafer. This results in degradation of performance of the semiconductor devices. In a worst case, the semiconductor devices do not function at all.

In conventional semiconductor device manufacturing exposure apparatuses, an operator has to move the mask with his hands onto a mask holder of the exposure apparatus. Since the operator is a substantive source of foreign particles, there is a high possibility that foreign particles flown out from the operator adhere to the mask during such manual handling of the mask. In addition, the recent increase in size or diameter of the mask makes the handling of the mask difficult, which is liable to cause damage of the mask due to careless mishandling by the operator.

In view of this, there have been desired development of a dust-shield container for the mask and development of an automatic feeding/loading system for automatically feeding/loading the mask without the aid of operator's hands.

SUMMARY OF THE INVENTION

It is accordingly a primary object of the present invention to provide a dust-shield container of cassette-type, for containing a sheet-like member such as the mask while protecting it from adhesion of any dust or foreign particles.

It is another object of the present invention to provide a dust-shield container of cassette-type, for containing a sheet-like member such as the mask while tightly shielding it from any dust or foreign particles.

It is a further object of the present invention to provide an automatic feeding system and a dust-shield cassette suitably usable with the feeding system, for automatically loading/unloading and feeding a sheet-like member such as the mask, while protecting the sheet-like member from adhesion of any dust or foreign particles.

Briefly, according to the present invention, there is provided a cassette-type container for a sheet-like member, having a lower member for carrying the sheet-like member, an upper member engageable with the lower member to define a closed chamber, a guide channel formed in the upper member, for guiding rectilinear movement of the upper member when it is engaged by or disengaged from the lower member, a guide pin formed on the lower member and engageable with the guide channel so that the upper member is pivotally movable relative to the lower member, and a member for holding the upper member and lower member against separation.

According to another aspect of the present invention, there is provided an automatic feeding system for a sheet-like member and usable with such container as above, the system having a holder for the upper member, a member for applying a biasing force to urge the holder to rotate it about the guide pin, a fork adapted to separate the lower member from the upper member, and an elevator for moving the fork in a direction perpendicular to the direction of the rectilinear movement of the lower member.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A–6D are schematic views, respectively, showing the manner of combination/separation of a cover member and a tray member of a dust-shield cassette according to an embodiment of the present invention.

FIGS. 9A–9D are schematic views, respectively, showing the manner of automatic combination/separation of a cover member and a tray member of a dust-shield cassette by the automatic feeding system of FIG. 7.

FIG. 10 is a section taken on line C—C in FIG. 9A, as viewed in the direction of the arrow.

FIG. 11 is a schematic view showing the principle of position detection by means of an index plate and a position detecting system shown in FIG. 7.

FIG. 12 is a cross-sectional view showing the index plate and the position detecting system of FIG. 11.

DESCRIPTION OF THE PREFERRED EMBODIMENTS

Figure 1:
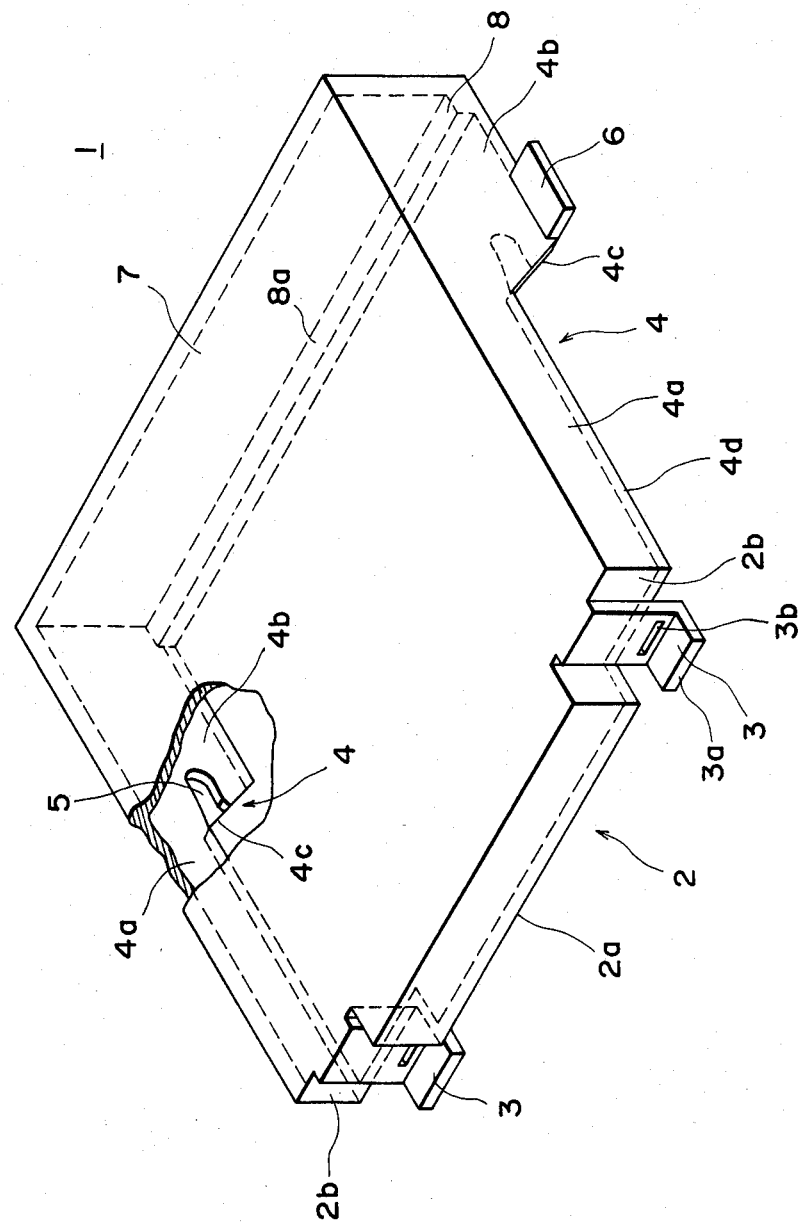
FIG. 1 is a perspective view of a cover member of a dust-shield cassette according to one embodiment of the present invention.
Figure 2:
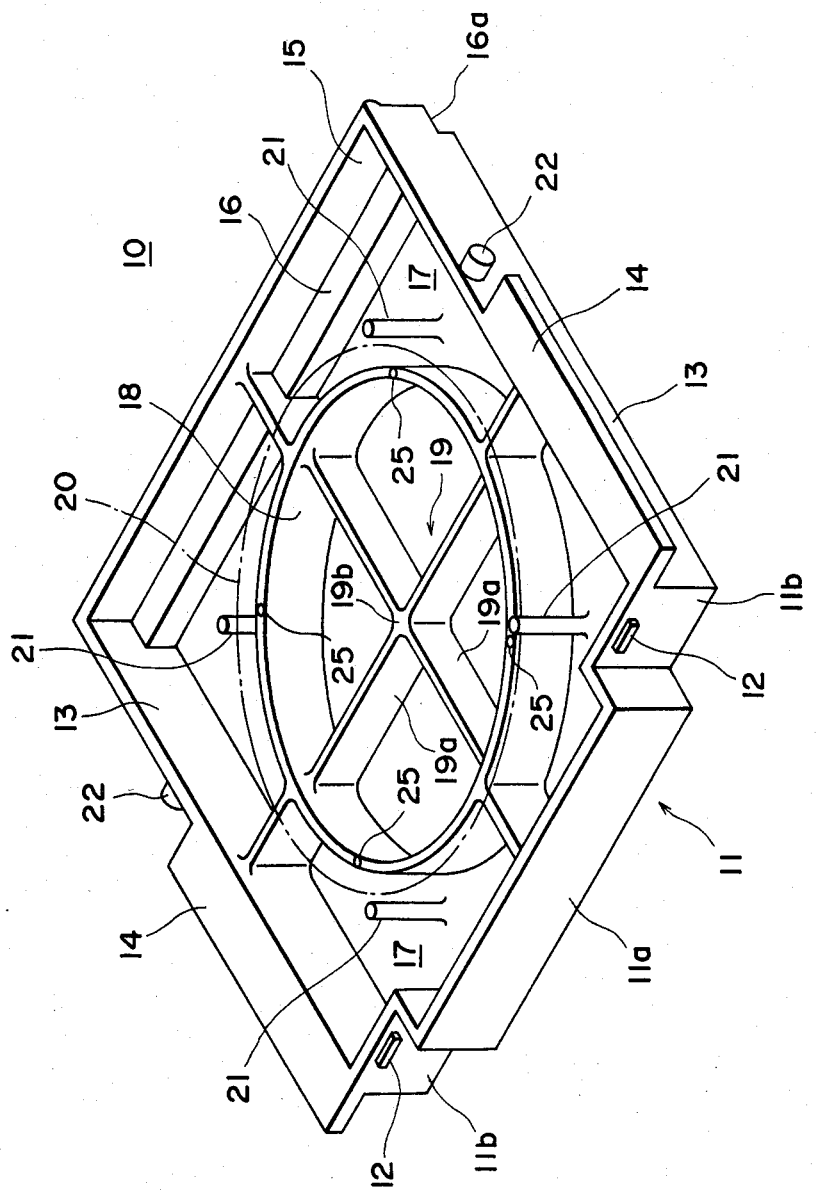
FIG. 2 is a perspective view of a tray member of the dust-shield cassette according to the one embodiment of the present invention.
Figure 3:
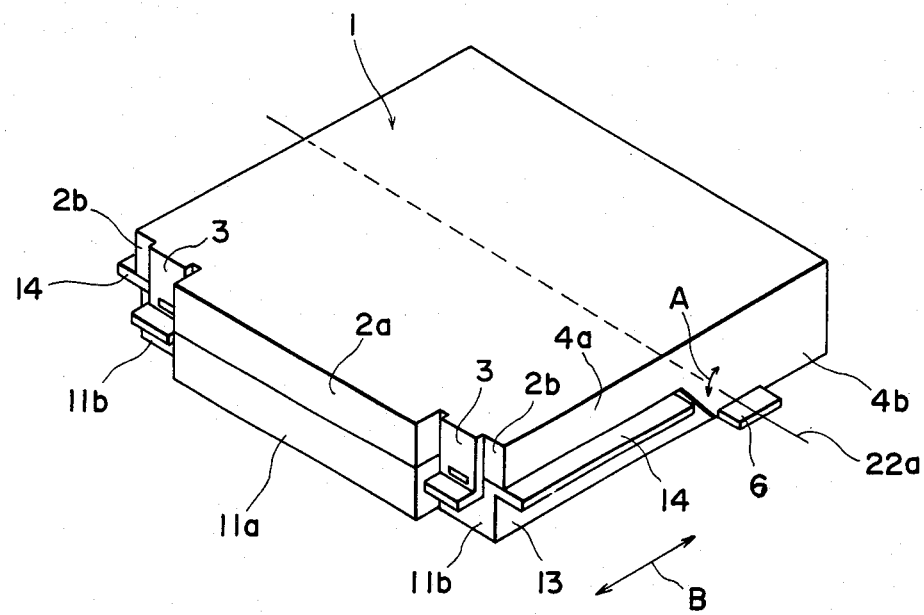
FIG. 3 is a perspective view showing the cover member of FIG. 1 and the tray member of FIG. 2 which are combined into the dust-shield cassette according to the one embodiment of the present invention.

FIG. 1 shows an upper or cover member of a dust-shield cassette according to an embodiment of the present invention, while FIG. 2 shows a lower or tray member of the dust-shield cassette. The cover member of FIG. 1 and the tray member of FIG. 2 are combined with each other into the dust-shield cassette which is illustrated in FIG. 3.

As shown in FIG. 1, the cover member 1 has a front wall 2 whose central portion 2a protrudes or extends forwardly beyond side portions 2b. Integrally formed on each of the side portions 2b is a flexible engaging member 3 of L-shape. Each of the engaging members 3 includes a vertically depending portion extending downwardly beyond the lower face of the front wall 2 and a forwardly protrudent portion 3a extending from the depending portion. Each of the engaging members 3 has a slot 3b which is formed through the depending portion and is adapted to engage a corresponding one of engaging protrusions 12 (FIG. 2) formed at corresponding positions on side portions 11b of a front wall 11 of the tray member 10, when the cover member 1 and the tray member 10 are combined with each other (FIG. 3). By engaging the protrusions 12 of the tray member 10 with the engaging members 3 of the cover member 1, the dust-shield cassette composed of the cover member and the tray member is latched and thus closed tightly.

The front face of the central portion 2a of the front wall 2 of the cover member 1 protrudes forwardly beyond the front faces of the protrudent portions 3a of the engaging members 3, in order to protect the engaging members 3 against breakage due to possible dropping of the cassette, or the like.

The cover member 1 further includes side walls 4 each of which is defined by a first wall portion 4a having the same height as of the front wall 2 and a second wall portion 4b having a sufficient height so that it reaches the bottom of the tray member 10 when the cover member 1 and the tray member 10 are combined with each other.

Figure 4:
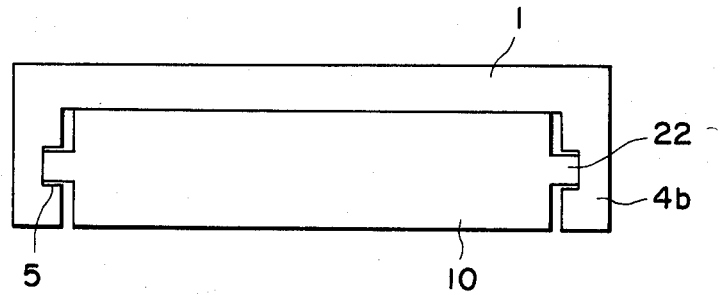
FIG. 4 is a schematic view showing the dust-shield cassette of FIG. 3, cut along a vertical plane containing a pivot axis 22a shown in FIG. 3.
Figure 5:
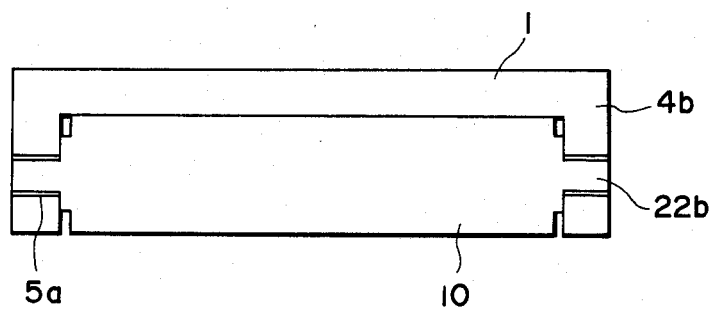
FIG. 5 is a view similar to FIG. 4 but showing a modified form of dust-shield cassette.

Formed in the internal surface of the second wall portion 4b of each side wall 4 is a guide channel 5 which extends horizontally from an inclined edge 4c of the second wall portion 4b. As will be described later, each of the guide channels 5 is adapted to receive an associated one of guide pins 22 (FIG. 2) formed on the tray member 10, when the cover member 1 and the tray member 10 are being combined with each other. While the guide channels 5 are of groove-shape as is best seen in FIG. 4, they may be slots such as 5a in FIG. 5 formed through the side walls 4b so that the guide pins such as 22b in FIG. 5 extend through the guide channels 5a, respectively. In any case, when the guide pins are engaged by the guide channels so that the cover member 1 and the tray member 10 are combined or maintained in combination, the relative displacement of the tray member 10 in a horizontal plane and in a lateral direction, i.e., the direction parallel to the axis 22a of the guide pins 22 is limited.

The cover member 1 has tabs 6 which are formed at lower positions on the second wall portions 4b of the side walls 4. These tabs 6 are adapted to be used, when the cassette is inserted into a cassette carrier 31 in FIG. 7 (which will be described later), so that the cover member 1 of the cassette is rotatably held by the cassette carrier.

The cover member 1 further includes a rear wall 7 having an inwardly stepped portion 8 formed at a lower position on an inner surface of the rear wall 7. As is best seen in FIG. 1, the step 8 extends between the side walls 4 of the cover member 1. The step 8 is arranged so that, when the cover member 1 and the tray member 10 are in a combined state, the upper surface 8a of the step 8 engages and supports a lower surface 16a of an inwardly stepped portion 16 (FIG. 2) formed on the tray member 10, as will be described later.

As is shown in FIG. 2, the tray member 10 of the dust-shield cassette includes a front wall 11 whose central portion 11a is protrudent forwardly beyond side portions 11b, similarly to the front wall 2 of the cover member 1. Formed on the side portions 11b respectively are the engaging protrusions 12 as aforesaid which are adapted to be engaged by the engaging members 3 formed on the side portions 2b of the cover member 1. The tray member 10 further includes side walls 13 having extensions 14. Each of the extensions 14 is formed at an upper end of an associated one of the side walls 13 and protrudes laterally outwardly so that, when the cover member 1 and the tray member 10 are combined with each other, the lower surface 4d (FIG. 1) of corresponding one of the first side wall portions 4a of the cover member 1 is carried by the extension 14. Preferably, each of the extensions 14 has a length in a direction B (FIG. 3) which is substantially equal to the length, in the same direction B, of the first side wall portion 4a of the cover member 1, in order to improve sealing or shielding characteristics of the cassette when the cover member 1 and the tray member 10 are combined. As will be described later, the side edge portions of the extensions 14 are adapted to be held by cassette supporting means in the cassette carrier 31 (FIG. 7) and also to be held by a fork unit 50 (FIG. 8) in the case of automatic feeding.

Each of the side walls 13 of the tray member 10 has the guide pin 22 as aforesaid which is formed at a position adjacent to the extension 14 and is adapted to be engaged or received by an associated one of the guide channels 5 formed on the second side wall portions 4b of the cover member 1. When the guide pins 22 received by the guide channels 5 are at their innermost positions within the guide channels 5, provided that the engaging members 3 of the cover member 1 are out of engagement with the protrusions 12 of the tray member 10, the cover member 1 is rotatable or swingable as shown by an arrow A in FIG. 3 relative to the tray member 10 about the axis 22a connecting the guide pins 22 located at their innermost positions within the guide channels 5 of the cover member 1.

The tray member 10 further includes a rear wall 15 having the inwardly stepped portion 16 as aforesaid which is shaped correspondingly to the step 8 formed at the lower end of the inner surface of the rear wall 7 of the cover member 1.

An annular wall member 18 is formed in the interior of the tray member 10. The annular wall member 18 is erectly formed on a bottom 17 of the tray member 10 and is adapted to support or carry a mask 20 when it is introduced into the cassette. Orthogonally extending rib 19 connects the annular wall member 18 with the middle portions of the four walls 11a, 13, 15 and 13. Usually, in the exposure apparatus, the mask 20 is held at the exposure station with its pattern bearing surface facing downwardly. For this reason, the mask 20, when it is introduced into the cassette, is carried by the annular wall portion 18 with its pattern bearing surface facing downwardly. In view of this, preferably such portion 19a of the rib 19 located within the annular wall portion 18 has a lower height to prevent contact with the pattern bearing surface of the mask 20. More preferably, a plurality of protrusions 25 are formed equidistantly on the upper annular surface of the annular wall portion 18 to support the mask 20 when it is introduced into the cassette.

In many cases, the mask 20 is provided with a pellicle film to prevent adhesion of any dust or foreign particles to the pattern bearing surface of the mask 20. Similarly, such mask having the pellicle film can be carried by the annular wall portion 18 with its pattern bearing surface facing downwardly. In such case, the annular wall portion 18 has an inner diameter sufficiently greater than the outer diameter of the pellicle film and the rib portion 19a has a height which is sufficiently low in view of the thickness of a frame member for the pellicle film.

Disposed around the annular wall portion 18 are positioning pins 21 which are located concentrically with respect to the orthogonally intersecting portion 19b of the rib 19. The positioning pins 21 stand erect on the bottom 17 of the tray member 10 and are adapted to center the mask 20 within the tray member 10 when the mask 20 is carried by the annular wall portion 18. Preferably, each of the positioning pins 21 has a height substantially equal to or higher than the position of the upper surface of the mask 20 when it is carried by the annular wall portion 18.

Referring now to FIGS. 6A-6D, the manner of combining the cover member 1 and the tray member 10 into the dust-shield cassette as well as the manner of separating the cover member 1 and the tray member 10 from each other will be described.

First, how to combine the separated cover member and tray member will be described. The mask 20 is contained in the tray member 10 (FIG. 6D), while being carried by the annular wall portion 18 (FIG. 2) and positioned by the positioning pins 21. The tray member 10 carrying the mask 20 and having its rear wall 15 facing the inner surface of the rear wall 7 of the cover member 1 is relatively moved toward the cover member 1 in a direction slightly inclined relative to the cover member 1 (FIG. 6D), so that the guide pins 22 formed on the side walls 13 of the tray member 10 are inserted into and received by the guide channels 5 formed in the second side wall portions 4b of the cover member 1 (FIG. 6C). When the guide pins 22 reach their innermost positions within the guide channels 5, the lower surface 16a of the step 16 of the tray member 10 rides on the upper surface 8a of the rear step 8 of the cover member 1 (FIG. 6B). Subsequently, the cover member 1 is moved counterclockwise, as viewed in FIG. 6B, relative to the tray member 10 about the axis 22a (FIG. 3) of the guide pins 22. By this rotational movement, the engaging members 3 of the cover member 1 are brought into latching-engagement with the engaging protrusions 12 formed on the tray member 10, whereby the cover member 1 and the tray member 10 are combined into the dust-shield cassette of closed position such as shown in FIGS. 6A and 3.

The cover member 1 and the tray member 10, in the combined form, can be separated from each other by effecting the above-described operations in the reverse order, such as in the sequence from FIG. 6A to FIG. 6D.

Referring now to FIGS. 7-12, an automatic feeding system according to an embodiment of the present invention, for automatically feeding the mask, will be described.

Figure 7:
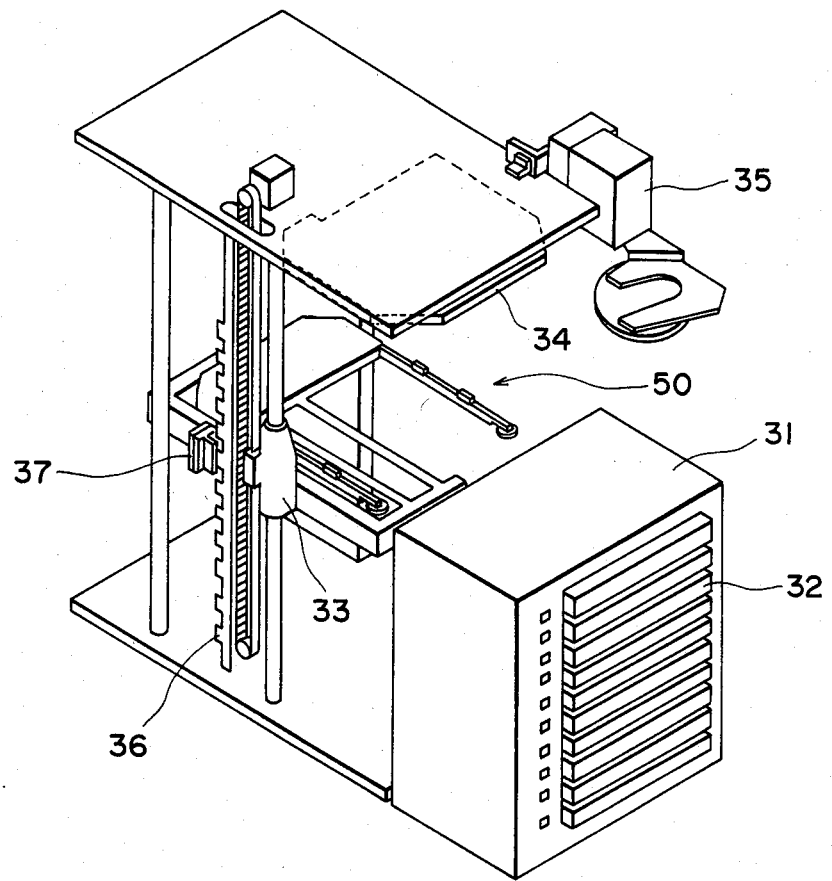
FIG. 7 is a perspective view of an automatic feeding system according to an embodiment of the present invention.

As shown in FIG. 7, the automatic feeding system includes the cassette carrier 31 as aforesaid in which a plurality of dust-shield cassettes 32 each corresponding to the cassette of FIG. 3 and containing a mask such as 20 in FIG. 2 are stored in a stacked fashion. The automatic feeding system further includes an elevator unit 33 which is movable upwardly and downwardly. The fork unit 50 as aforesaid is connected to and supported by the elevator unit 33, so that it is movable upwardly and downwardly with the elevator unit 33. By this fork unit 50, a particular cassette containing a particular one of the masks, more particularly only its tray member carrying the one mask is automatically taken out from the cassette carrier 31 and fed toward a wafer prealignment stage 34 which is located above the uppermost position of the fork unit 50. This will be described later in more detail. When the fork unit 50 holding the tray member on which the mask is carried reaches its uppermost position, only the mask carried by the tray member is held by a mask hand unit 35 by vacuum suction or the like and then is moved to an unshown exposure stage.

The position of the fork unit 50 with respect to its upward or downward movement is detected precisely by a combination of an index plate 36 fixedly secured to a frame of the feeding system and a photo-switch unit 37 fixedly secured to the elevator unit 33 or the fork unit 50. Details of the position detection will be described later with reference to FIGS. 11 and 12.

Figure 8:
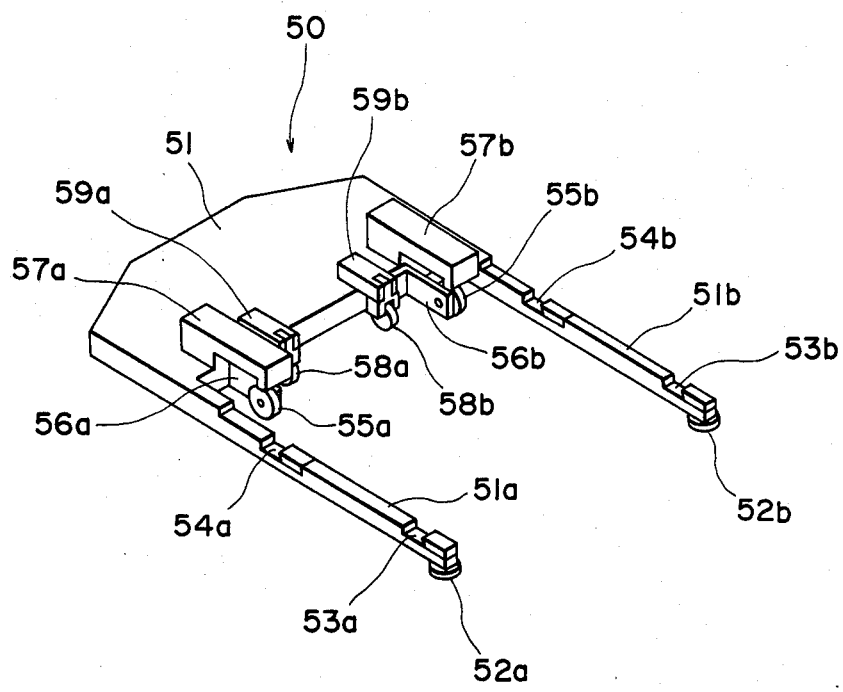
FIG. 8 is a perspective view of a fork unit of the automatic feeding system of FIG. 7.

Referring now to FIG. 8, there is shown the fork unit 50 of the automatic feeding system. The fork unit 50 includes a base plate 51 having two arms 51a and 51b extending from one side edge of the base plate 51. Rotatable rollers 52a and 52b are provided at the free ends of the arms 51a and 51b, respectively. These rollers 52a and 52b are engageable with the side walls of the tray member of the cassette when the arms 51a and 51b enter into the cassette carrier 31, to thereby adjust the position of the cassette relative to the fork unit 50 in a lateral direction, i.e. a direction perpendicular to the direction of entering movement of the arms.

Each of the arms 51a and 51b has two notches 53a and 54a; 53b and 54b. These notches are adapted to engage respectively with four protrusions (only three being shown in FIGS. 9A-9D and 10 by numerals 41a, 42a and 42b) formed on the lower surfaces of the extensions 14 of the tray member 10, when it is fed by the fork unit 50.

Rotatable rollers 55a and 55b are mounted on the one side edge of the base plate 51 by way of L-shaped members 56a and 56b, respectively. The rollers 55a and 55b are adapted to urge upwardly the engaging members 3 of the cover member 1, upon automatic separation of the cover member and the tray member of the cassette, to disengage the engaging members 3 from the protrusions 12 of the tray member 10. This will be described later in more detail.

The fork unit 50 further includes pawls 57a and 57b which are fixedly secured to the one side edge of the base plate 51 and overhang the rollers 55a and 55b, respectively. As will be described later, the pawls 57a and 57b are adapted to urge downwardly the extensions of the engaging members 3 of the cover member, upon automatic combination of the cover member with the tray member, to bring the engaging members 3 into engagement with the protrusions 12 of the tray member.

Keep rollers 58a and 58b are swingably secured to the one side edge of the base plate 51. These keep rollers 58a and 58b are adapted to urge the tray member 10 in a direction toward the free ends of the arms 51a and 51b, when these arms take the tray member out of the cassette carrier 31, to thereby hold the tray member stationary on the arms 51a and 51b.

Each of the cassettes 32 (FIG. 7) is held in its place within the cassette carrier 31. This will now be described with reference to FIGS. 9 A and 10. FIG. 10 is a section taken on line C—C shown in FIG. 9A, as viewed in the direction of arrow; whereas FIG. 9A is a section taken on line D—D in FIG. 10, as viewed in the direction of arrow.

The cassette in a combined form is inserted into the cassette carrier 31 (FIG. 7) in a direction from right to left as viewed in FIG. 9A. When the cassette is inserted into the cassette carrier 31, the two extensions 14 of the tray member 10 are sandwiched between six pairs of guide bearings 61a-61a, 61b-61b supported by side walls 31a and 31b of the cassette carrier 31 (see FIG. 10) by way of support members 60a and 60b. By this arrangement, the tray member 10 is held within the cassette carrier 31.

On the other hand, each of the tabs 6 formed on the second side wall portions 4b (FIG. 1) of the cover member 1 is sandwiched between two holding members 62 and 63 of L-shape in cross-section pivotably mounted on the support members 60a and 60b fixed to the side walls 31a and 31b of the cassette carrier 31 (FIG. 10). By this arrangement, the cover member 1 is held within the cassette carrier 31 for pivotal movement about the axis 22a (FIG. 3) of the guide pins 22 of the tray member 10.

A coiled spring 64 has one end connected to the end of the holding member 63 and the other end connected to the side wall of the cassette carrier 31. The spring 64 applies a biasing force to the holding member 63 so that the holding member 63 together with the holding member 62 are normally urged clockwise as viewed in FIG. 9A. In addition, the holding member 63 is made pivotable counterclockwise as viewed in FIG. 9a about a pin 65 provided at the other end of the holding member 63, against the bias of the spring 64 and relative to the holding member 62. When the cassette is inserted into the cassette carrier 31 from right to left as viewed in FIG. 9A, the tab 6 of the cover member 1 pushes the holding member 63 so that it is moved counterclockwise about the pin 65 against the bias of the spring 64. When the cassette is inserted until the tab 6 abuts against the holding member 62, the holding member 63 is moved clockwise by the biasing force of the spring 64, whereby the tab 6 is sandwiched between the holding members 62 and 63.

The automatic feeding of the mask will now be described with reference to FIGS. 8, 9A–9D and 10.

First, the fork unit 50 is moved in the direction of arrow E (FIG. 9A) so that the arms 51a and 51b of the fork unit 50 are inserted into the cassette carrier 31. At this time, the position or height of the fork unit 50 is adjusted by the elevator unit 33 such that the protrusions 3a of the engaging members 3 of the cover member 1 are positioned between the rollers 55a, 55b and the pawls 57a, 57b of the fork unit 50 (FIG. 9A).

Subsequently, the elevator unit 33 is driven to move the fork unit 50 upwardly, as denoted by an arrow F in FIG. 9B, through a distance Δ (approx. few milimeters). By this upward movement, the upper surfaces of the arms 51a and 51b contact the lower surfaces of the extensions 14 of the tray member 10 and, simultaneously therewith, the protrusions 41a–42b formed on the lower surfaces of the extensions 14 are received by the notches 53a–54b of the arms 51a and 51b, respectively. During the upward movement of the fork unit 50, the rollers 55a and 55b of the fork unit engage with the protrusions 3a of the engaging members 3 of the cover member 1 and push them upwardly. By such upward forces applied to the protrusions 3a, the engaging members 3 are disengaged from the protrusions 12 of the tray member 10. When the engaging members 3 are disengaged, the cover member 1 is moved clockwise about the guide pins 22 by the biasing force of the spring 64. The position of the cover member 1 in the rotational direction is limited by an unshown stopper, and the cover member 1 is held at an inclined position shown in FIG. 9B.

Subsequently, the fork unit 50 is retracted horizontally, as denoted by an arrow G in FIG. 9C. By this backward movement, the protrusions 41a–41b on the lower surfaces of the extensions 14 of the tray member 10 engage respectively with the end faces of the notches 53a–54b of the arms 51a and 51b. By this engagement, the subsequent backward movement of the fork unit 50 (i.e. the arms 51a and 51b) is effective to take the tray member 10, carrying the mask, out of the cassette carrier 31. Since the cover member 1 is held fixed by the holding members 62 and 63 against movement in the mask feeding direction, namely the direction of arrow G, the backward movement of the arms 51a and 51b separates the tray member 10 from the cover member 1. The tray member 10 carried by the arms 51a and 51b is urged in the direction toward the free ends of the arms by the rollers 58a and 58b (FIG. 8), whereby the tray member 10 is held stationary on the arms 51a and 51b.

When the fork unit 50 is moved backwardly to a predetermined position (FIG. 9D), the elevator unit 33 is driven to move upwardly the fork unit 50 to its uppermost position under the mask alignment stage 34. At this uppermost position of the fork unit, the mask 20 carried by the tray member 10 is taken away by vacuum suction or the like and is moved to the mask alignment stage 34. After completion of alignment, the mask 20 is held by the mask hand unit 35 and then fed to the exposure station.

When the mask is to be moved back into the cassette, the above-described operations are carried out in the reversed order. Namely, the mask is moved by the mask hand unit 35 onto the tray member 10 and then the tray member 10 carrying the mask is moved by the fork unit 50 toward the cover member 1 (FIGS. 9D and 9C) until the guide pins 22 of the tray member 10 reach their innermost positions in the guide channels 5 of the cover member 1 (FIG. 9B). Subsequently, the elevator unit 33 is driven to move the fork unit 50 downwardly through a distance Δ. By this downward movement, the pawls 57a and 57b of the fork unit 50 engage respectively with the protrusions 3a of the engaging members 3 of the cover member 1 and push them downwardly. As the result, the tray member 1 is moved counterclockwise as viewed in FIG. 9B about the guide pins 22 and, finally, the engaging members 3 of the cover member 1 are brought into engagement with the protrusions 12 of the tray member 10. Accordingly, the cover member 1 and the tray member 10 are combined into a unit cassette container (FIG. 9A). Thereafter, the fork unit 50 is retracted horizontally, i.e. in a direction opposite to the direction of arrow E in FIG. 9A.

Referring to FIGS. 7, 11 and 12, details of the position detection for the fork unit 50 will now be described. As described hereinbefore, the index plate 36 is fixedly secured to the frame of the automatic feeding system. The index plate 36 is composed of an elongated member formed of a material non-transmissive to light. The elongated member has a corrugated side edge to define light-blocking portions 36a and light-transmitting portions 36b in an alternate manner. Each of the light-blocking portions 36a has a width $L_1$ in the direction of elongation of the index plate 36, while each of the light transmitting portions 36b has a width $L_2$, wherein $L_1$ is not equal to $L_2$. The sum of the widths $L_1$ and $L_2$ is equal to the distance between the positions of the adjacent cassettes contained in the cassette carrier 31.

The photo-switch unit 50 includes a base and two opposing extension walls extending from the base and sandwiching therebetween the index plate 36, as is best seen in FIG. 12. The photo-switch unit 50 has four photo-switches 37a–37d each of which is composed of a light emitting element 37P such as a light-emitting diode or the like and a light receiving element 37Q such as a photoreceptor. The lightemitting element 37P and the light-receiving element 37Q of each of the photo-switches 37a–37d are disposed on the two opposing extension walls of the photo-switch unit 50, respectively, so that they oppose each other. In response to reception of light from the light-emitting element 37P by the light-receiving element 37Q, the photo-switch produces a signal having a level corresponding to the quantity of light received by the light-receiving element 37Q.

The photo-switches 37a–37d provided on the photo-switch unit 50 are arranged in an array extending in the direction of movement of the photoswitch unit 37, as is shown in FIG. 11. In this Figure, white circles having numerals 37a–37d denote the positions of the switches 37a–37d when the fork unit 50 is at a raised position (FIG. 9B position) with respect to a particular one of the cassettes contained in the cassette carrier 31. On the other hand, black circles in FIG. 11 having numerals 37a'–37d' denote the positions of the switches 37a–37d when the fork unit 50 is at a lower position (FIG. 9A position) with respect to the same cassette. The positional relation between the switches 37a–37d are such that the distance between the switches 37a and 37b is substantially equal to $L_2 - \Delta$; the distance between the switches 37b and 37c is substantially equal to $L_1$; the distance between the switches 37c and 37d is substantially equal to $L_2 + \Delta$; and the distance between the switches 37a and 37d is substantially equal to $L_1 + 2 \times L_2$, wherein $\Delta$ is equal to the difference or distance between the lower position (FIG. 9A position) and the raised or upper position (FIG. 9B position) of the fork unit 50 with respect to a particular cassette.

In this embodiment of the present invention, the upper position (FIG. 9B position) and the lower position (FIG. 9A position) of the fork unit 50 are detected by two pairs of photo-switches 37a–37d, respectively. More specifically, the upper position (FIG. 9B position) of the fork unit 50 is detected by a combination of the switches 37a and 37d when they are located at the positions denoted by the white circles 37a and 37d in FIG. 11. On the other hand, the lower position (FIG. 9A position) of the fork unit 50 is detected by another combination of the switches 37b and 37c when they are located at the positions denoted by the black circles 37b' and 37c' in FIG. 11. With this arrangement, the position of the fork unit 50 can be detected with higher accuracies. In addition thereto, it is possible to detect any shortage of displacement and any excess of displacement of the elevator unit 33 and thus of the fork unit 50.

That is, if, during the course of movement of the elevator unit 33, the fork unit 50 is at a position before the target or aimed position (the FIG. 9A position or FIG. 9B position), one of the pair of switches 36b and 36c (or switches 36a and 36d) is in an OFF stage (wherein no light is received by its photoreceptor), while the other switch is in an ON state (wherein light is receivd by its photoreceptor). If, on the other hand, the fork unit 50 overruns the target position, the first aforesaid one switch comes into an ON state whereas the second aforesaid other switch comes into an OFF state. Therefore, by checking the outputs of the switchs, the shortage of displacement and the excess of displacement of the elevator unit 33 can be discriminated.

In the embodiment shown in FIGS. 1–3, each of the lower abutting surfaces of the front wall 2 of the cover member 1 and the upper abutting surface of the front wall 11 of the tray member 10 is flat. However, they may be shaped in step form as shown in FIGS. 6A–6D. Further, the rear wall of the cover member 1 may be provided with an inwardly stepped portion such as shown in FIGS. 9A–9D, for the sake of ease of grip by an operator.

Moreover, the cover member 1 of the cassette may be provided with a keeping pad 24 shown in FIG. 6D to prevent damage of the mask surface due to an desirable movement of the mask stored in the cassette in the combined form (FIG. 6A).

As for the material of the cover member 1 and the tray member 10 of the cassette, Poly Ether Ether Ketone (PEEK) resin is preferable. The PEEK resin has a high resistivity to various cleaning agents and also has a high mechanical strength.

In the foregoing embodiments, the invention has been described with reference to a container for a circular mask. However, the invention is also applicable to a container for a rectangular mask.

In accordance with the present invention, as has hitherto been described, the storage of the mask and the feeding of the mask to the exposure station can be carried out while completely isolating the mask from the operator. Therefore, adhesion of any dust or foreign particles to the mask can be effectively suppressed. Further, the attachment and detachment of the lower or tray member to and from the upper or cover member can be achieved substantially only by relative pivotal movement therebetween. It is not necessary to slidingly drag one of the upper cover member and the lower tray member relative to the other through a substantial distance. Therefore, production of dust or foreign particles which is liable to occur due to the relative sliding movement between elements is effectively prevented.

While the invention has been described with reference to the structures disclosed herein, it is not confined to the details set forth and this application is intended to cover such modifications or changes as may come within the purposes of the improvements or the scope of the following claims.

What is claimed is:

1. An automatic feeding system for a sheet-like member, comprising:
   a cassette-type container for containing the sheet-like member,
   wherein said container includes a lower member for carrying the sheet-like member, said lower member having a side wall and an extension formed on said side wall, an upper member engageable with said lower member to define a closed chamber, said upper member having a side wall and an extension formed thereon, a guide channel formed in the side wall of said upper member, for guiding rectilinear movement of said upper member when it is engaged by or disengaged from said lower member, a guide pin formed on the side wall of said lower member, said guide pin being engageable with said guide channel of said upper member so that said upper member is pivotally movable about said guide pin when the latter is at an innermost position in said guide channel, and means for holding said upper member and lower member against separation, said holding means including an engaging element formed on said upper member and another engaging element formed on said lower member and engageable with said engaging member of said upper member;

means for holding said extension formed on the side wall of said upper member;

means for applying a biasing force to said extension holding means to urge said extension holding means in a direction rotating it about said guide pin;

fork means adapted to carry thereon said extension formed on the side wall of said lower member, to separate said lower member from said upper member and to feed said lower member; and elevator means for moving said fork means in a direction perpendicular to the direction of the rectilinear movement of said lower member, to disengage said lower member from said upper member.

2. A system according to claim 1, wherein the position of said fork means with respect to movement thereof by said elevator means is detected photoelectrically.

* * * * *

UNITED STATES PATENT AND TRADEMARK OFFICE
CERTIFICATE OF CORRECTION

PATENT NO. : 4,611,967

DATED : September 16, 1986

INVENTOR(S) : SHINJI TSUTSUI

It is certified that error appears in the above-identified patent and that said Letters Patent is hereby corrected as shown below:

AT [57] IN THE ABSTRACT

Line 1, "member," should read --member--.

COLUMN 7

Line 6, "9 A" should read --9A--.
Line 63, "milimeters" should read --millimeters--.

COLUMN 8

Line 44, "reversed" should read --reverse--.

UNITED STATES PATENT AND TRADEMARK OFFICE
CERTIFICATE OF CORRECTION

PATENT NO. : 4,611,967
DATED : September 16, 1986
INVENTOR(S) : SHINJI TSUTSUI

It is certified that error appears in the above-identified patent and that said Letters Patent is hereby corrected as shown below:

COLUMN 9

Line 20, "lightemitting" should read --light-emitting--.
Line 31, "photoswitch" should read --photo-switch--.

Signed and Sealed this

Twelfth Day of July, 1988

Attest:

DONALD J. QUIGG

Attesting Officer

Commissioner of Patents and Trademarks